United States Patent [19]
Takubo et al.

[11] Patent Number: 5,304,843
[45] Date of Patent: Apr. 19, 1994

[54] SEMICONDUCTOR DEVICE USING FILM CARRIER

[75] Inventors: Chiaki Takubo, Yokohama; Hiroshi Tazawa; Yoshiharu Tsuboi, both of Tokyo; Masao Mochizuki, Yokohama, all of Japan

[73] Assignee: Kabushiki Kaisha Toshiba, Kawasaki, Japan

[21] Appl. No.: 947,969

[22] Filed: Sep. 21, 1992

Related U.S. Application Data

[63] Continuation of Ser. No. 707,766, May 30, 1991, abandoned.

[30] Foreign Application Priority Data

Jun. 1, 1990 [JP] Japan .................. 2-141304
Sep. 25, 1990 [JP] Japan .................. 2-251990

[51] Int. Cl.$^5$ .................. H01L 23/48; H01L 21/56
[52] U.S. Cl. .................. 257/670; 257/672; 257/676; 257/750; 257/751; 257/773; 257/787; 437/211; 437/217; 437/219
[58] Field of Search .................. 357/70; 257/670, 672, 257/676, 750, 773, 751, 787; 437/180, 211, 217, 219

[56] References Cited

U.S. PATENT DOCUMENTS

| | | | |
|---|---|---|---|
| 4,246,595 | 1/1981 | Noyori et al. .................. | 357/70 |
| 4,903,114 | 2/1990 | Aoki et al. .................. | 357/70 |
| 4,953,173 | 8/1990 | Fujitsu .................. | 257/676 |
| 5,021,866 | 6/1991 | Sudo et al. . | |

FOREIGN PATENT DOCUMENTS

| | | |
|---|---|---|
| 0004148 | 9/1979 | European Pat. Off. . |
| 0365783 | 5/1990 | European Pat. Off. .............. 357/70 |
| 365783 | 5/1990 | European Pat. Off. . |
| 3814469 | 11/1988 | Fed. Rep. of Germany . |
| 6484726 | 3/1989 | Japan . |
| 1-132147 | 5/1989 | Japan . |

OTHER PUBLICATIONS

IBM Tech. Dis. Bul.-vol. 32, No. 10A, Mar. 1990 "Plane Electrical Enhancement".

Primary Examiner—Edward Wojciechowicz
Attorney, Agent, or Firm—Oblon, Spivak, McClelland, Maier & Neustadt

[57] ABSTRACT

A semiconductor device, which uses a film carrier, comprises a semiconductor element with a plurality of terminals, a resin film with a first surface and a second surface, the film having a hole in which the semiconductor element is mounted, and a plurality of lead wires formed on the first surface of the resin film. Each lead wire has an inner lead, an intermediate lead and an outer lead. The inner lead is connected to a corresponding one of the terminals of the semiconductor element. The outer lead is connected to a corresponding external electrode. The intermediate lead is situated between the inner lead and the outer lead. At least said intermediate lead is formed on the first surface of the film. Each outer lead and that portion of the intermediate lead, which is close to the outer lead, is substantially on a level with the external electrode.

27 Claims, 12 Drawing Sheets

SEMICONDUCTOR DEVICE USING FILM CARRIER

This application is a continuation of application Ser. No. 07/707,766, filed on May 30, 1991, now abandoned.

BACKGROUND OF THE INVENTION

1. Field of the Invention

The present invention relates generally to a semiconductor device using a film carrier, and more particularly to a wiring structure of a high-speed operation semiconductor device using GaAs semiconductor, etc.

2. Description of the Related Art

With recent development in higher integration of an LSI or an IC, the number of electrode pads of a semiconductor device (hereinafter called "chip") to be supplied with input/output signals or electric power has increased more and more. As a result, power consumption has increased, and the operation speed has also increased. For example, a high-speed operation of about 100 ps is performed in an integrated circuit constituted by integrating field-effect transistors (FET) on a gallium-arsenic (GaAs) substrate. In addition, devices capable of operating at higher speeds, such as an HEMT (High-Electron Mobility Transistor) and an HBT (Hetero Junction Bipolar Transistor), have been developed.

In the prior art, bonding wires have been used to connect wires of a semiconductor device package with bonding pads on a chip. There is, however, such a problem that the bonding wires, which are connected in an arcuated fashion, may serve as open stubs in an integrated circuit performing high-speed signal processing of giga-bit/sec. and the length of each bonding wire is not negligible. Another problem is that the uniformity of electrical characteristics is lost owing to variations in the length of bonding wires. If the density of bonding pads increases as the integration of the integrated circuit becomes higher, bonding is made impossible owing to the contact between a bonding tool and adjacent wires. Furthermore, since the size and pitch of pads cannot be decreased so much, the reduction in chip size is limited. Consequently, the length of signal wires on the chip cannot be decreased.

FIG. 1 illustrates a technique which has been developed to mount a high-speed-operation integrated circuit, without incurring the above problem. This technique is called TAB (Tape Automated Bonding), in which metal foil wires are formed on an elongated flexible film substrate (hereinafter referred to as "film"). The wires are connected to input/output electrode pads on a chip via projection electrodes (bumps). The mount mode using TAB technique is generally called "film carrier."

FIG. 1 shows an important part of an elongated tape-like film 10. Openings 12 serving as chip mounting areas are successively formed in the film 10. A chip 14 is mounted in each opening 12. A plurality of lead wires 34 provided around the opening 12 are connected to the chip 14. Four openings 20 are formed so as to surround the opening 12 and the lead wires 34 provided on the film 10.

A resin mold 24 is applied onto a film region 22 surrounded by openings 20, as shown in FIG. 2A. Thereafter, four bridge portions 26 of the film 10 are cut, and the film region 22 is separated, as shown in FIG. 3. A semiconductor device is thus fabricated. The semiconductor device is placed on a substrate 28, as shown in FIG. 2A, and the lead wires 34 are connected to external electrodes 30. A heat radiation plate 32 is mounted on the bottom of the chip 14.

FIG. 2B is an enlarged view of a connection area where the outer lead 38 shown in FIG. 2A is connected to the external electrode 30 on substrate 28. The film region 22 is surrounded by resin mold 24. The wires on the film 10 are extended, and the wire portions below which no film is provided are extended outside of the resin mold 24. These wire portions are connected, as outer leads 38, to the external electrode 30 on the substrate 28.

The lead wires 34 serve as signal lines. Each lead wire 34 comprises an inner lead 36 connected to the chip, an outer lead 38 connected directly to the external electrode 30, and a portion 40 (hereinafter referred to as "intermediate lead") situated between the leads 36 and 38. The inner lead 36 projects from the film 10 and extends to an electrode pad (not shown), and the lead 36 and electrode pad are connected via a bump electrode.

The four openings 20 function to expose the bottom surfaces of the outer leads 38. As is shown in FIG. 3, when the semiconductor device has been fabricated, most parts of the bottom surfaces of outer leads 38 need to be out of contact with the film 10; thus, the outer leads 38 are arranged on the openings 20 in advance.

The elongated bridge portions 26 are provided between the four openings 20. The four bridge portions 26 support the lead wires 34 on the film region 22.

Feed perforations 42 for feeding the film 10 are formed at regular intervals in both side edge portions of the film 10, as shown in FIG. 1.

Where the above-described high-speed operation integrated circuit chip 14 is actually mounted, it is necessary to keep constant the characteristic impedance of signal lines 34 on the film substrate 10. Recently, film carriers have been proposed, which are designed such that the characteristic impedance of metal foil wires 34 on the film 10 is made constant in order to transmit signals at high speed. For example, according to the techniques disclosed in Published Unexamined Japanese Patent Application (PUJPA) No. 64-14933, PUJPA No. 64-14934 and PUJPA No. 63-302531, the characteristic impedance of transmission lines 34 on film 10 is set at 50 $\Omega$ for practical use.

FIG. 4 is a cross-sectional view of a so-called ground suspended coplanar transmission line, and FIG. 5 is a cross-sectional view of a microstrip line. Both FIGS. 4 and 5 are those taken along line A—A in FIG. 1.

In FIG. 4, the width of the signal line conductor 34 is W, and a predetermined distance G is provided between a ground conductor 52 and the signal line conductor 34. The film 10 and adhesive sheets 56 are interposed between a bottom ground conductor 54 and a top conductor pattern 34, 52. A distance H is provided between the bottom ground conductor pattern 54 and the top conductor pattern 34, 52. The film 10 is adhered to the conductor patterns 34, 52 and 54 with the adhesive sheets 56 interposed therebetween.

The characteristic impedance of the transmission line with the above structure is determined by the width W, distance G, distance H, thickness M of surface conductor pattern 34, 52, and dielectric constant $\epsilon_r$ of the film 10. For example, when the film 10 is formed of polyimide of dielectric constant $\epsilon_r = 3.5$, the conductors 34 and 52 are made of Cu with thickness M = 18 $\mu$m, W is set at 50 $\mu$m, G is set at 30 $\mu$m, and H is set at 75 $\mu$m, the characteristic impedance is about 50 $\Omega$. In this case, thickness A of adhesive layer 56 is 25 μm, and thickness P of film 10 is 25 μm.

In the prior art, outer leads 38 are formed of bare metallic conductors, each is about 3 to 5 mm long. As is shown in FIG. 2B, the transmission lines having a predetermined characteristic impedance are intermediate leads 40 provided on the film 10 within the resin mold. From the intermediate leads 40, bared outer leads 38 extend and are connected to the external electrode 30 on the substrate 28. The bared outer leads 38 do not have the predetermined characteristic impedance, and no film exists below the bared outer leads 38. Even if the package with this structure is mounted on the substrate 28, the characteristic impedance of the bare outer lead 38 differs from those of the intermediate lead 40 and external electrode 30, as shown in an equivalent circuit of FIG. 6. Thus, wave distortion occurs in the electric signal owing to the non-uniformity of the characteristic impedances.

Where an input signal is supplied at normal speed, the non-uniformity of the characteristic impedance is not substantially affected. However, for example, where a high-speed input signal is supplied through signal wire 34 to a MESFET in a signal input unit of a GaAs logical integrated circuit, with the characteristic impedance of lead wire 34 being not uniform, the signal is reflected at the part at which the impedance is not uniform. As a result, the waveform is distorted, and normal logical operation cannot be carried out.

As stated above, regarding a film carrier using TAB techniques, if an outer lead portion, in which the characteristic impedance is not adjusted to be constant, is shaped and connected to an electrode on an external mount substrate, the characteristic impedance of the outer lead portion differs from that of the transmission line on the film carrier and that of the transmission line on the external mount substrate. Thus, the high-speed signal is reflected by the outer lead portion, and the waveform of the electric signal is distorted.

SUMMARY OF THE INVENTION

The object of the present invention is to provide a semiconductor device wherein the characteristic impedance of transmission lines can be made uniform.

In order to achieve the above object, there is provided a semiconductor device comprising:

a semiconductor element with a plurality of terminals;

a resin film with a first surface and a second surface, said film having a hole in which the semiconductor element is mounted; and a plurality of lead wires formed on the first surface of the resin film, each lead wire having an inner lead, an intermediate lead and an outer lead, said inner lead being connected to a corresponding one of the terminals of the semiconductor element, said outer lead being connected to a corresponding external electrode, said intermediate lead being situated between the inner lead and the outer lead, at least said intermediate lead being formed on the first surface of the film, and each outer lead and that portion of the intermediate lead, which is close to the outer lead, being substantially on a level with the external electrode.

With the above structure, the characteristic impedance of the external electrode on the external mount substrate and that of the transmission line on the film can be adjusted to be uniform. Thus, electrical discontinuity can be eliminated.

If a reinforcement metal film is further provided, the processibility of the film can be improved.

According to the present invention, the discontinuity of characteristic impedance of transmission line on the film carrier, on which a high-speed-operation semiconductor device is mounted, can be decreased to a minimum. Thus, good high-frequency characteristics can be obtained. In addition, the metal film attached to the film carrier can remarkably improve the processibility of the film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Embodiments of the semiconductor device according to the present invention will now be described with reference to the accompanying drawings.

Figure 7:
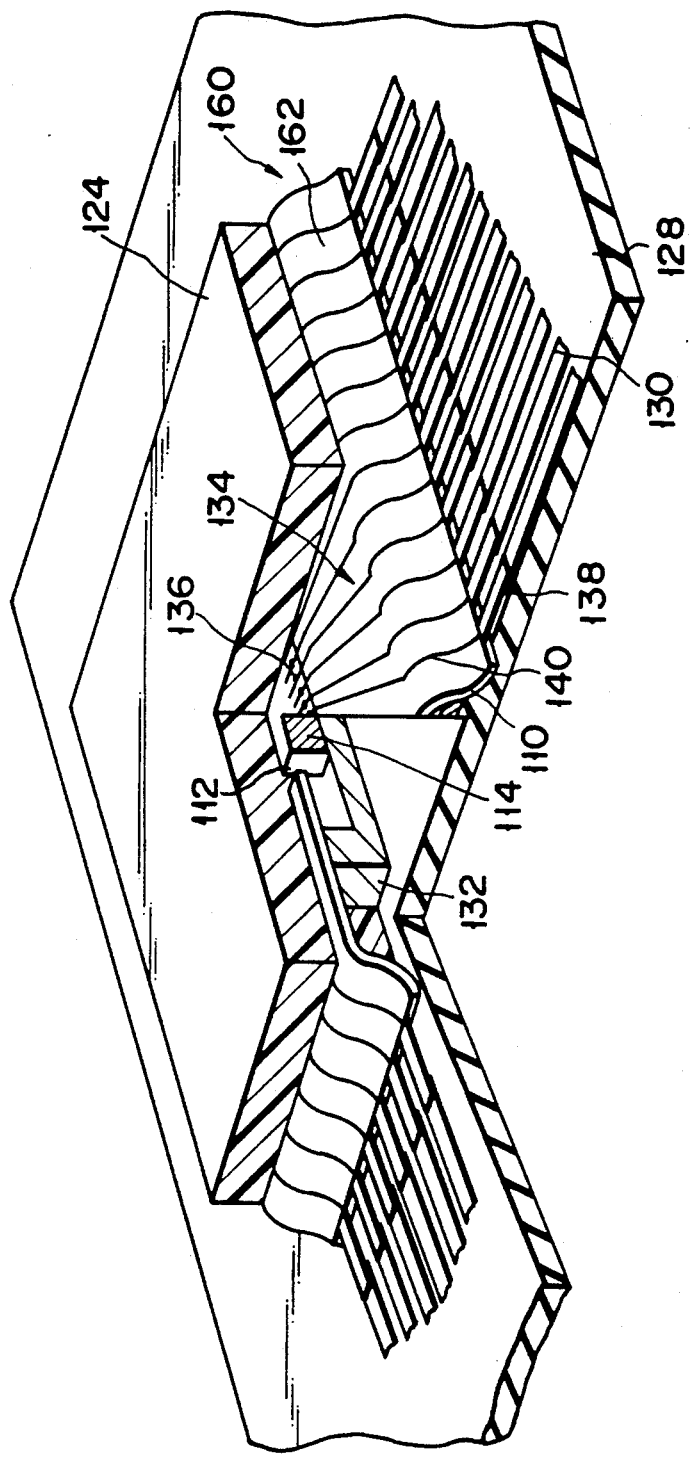
FIG. 7 is a partially cut-out perspective view of a semiconductor device according to a first embodiment of the present invention.
Figure 8:
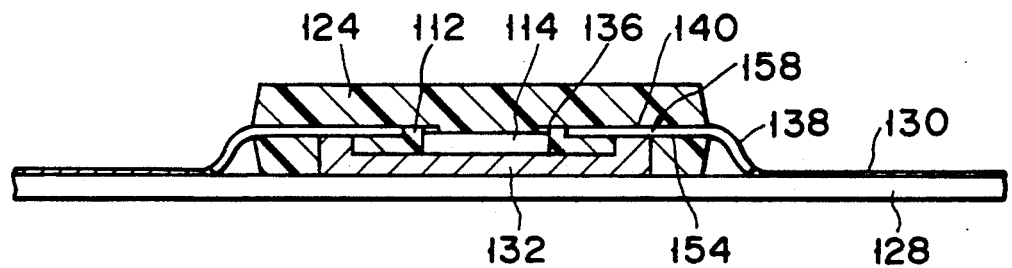
FIG. 8 is a cross-sectional view of the semiconductor device according to the first embodiment.

FIG. 7 is a partially cut-out perspective view of an important part of a semiconductor device according to a first embodiment of the invention, and FIG. 8 is a cross-sectional view of the semiconductor device.

The semiconductor device comprises a substrate 128, a plurality of external electrodes 130 provided on the substrate 128, a heat radiation substrate 132, a semiconductor chip 114, a film carrier 158, and an insulator mold 124.

The semiconductor chip 114 is attached on the heat radiation substrate 132 by means of an adhesive. A plurality of pads are provided on the semiconductor chip 114.

The heat radiation substrate 132 is made of a copper plate or the like, and is provided on the substrate 128. The radiation substrate 132 functions to radiate heat from the semiconductor chip 114. The substrate 132 is not indispensable in the present invention, and it may be removed. In such a case, a filler having good thermal conductivity, such as fused silica or crystalline silica, is added to the resin mold 124 of epoxy or silicone for molding and sealing the semiconductor chip 114 and film carrier 158, thereby enhancing the thermal conductivity of the resin.

Figure 9:
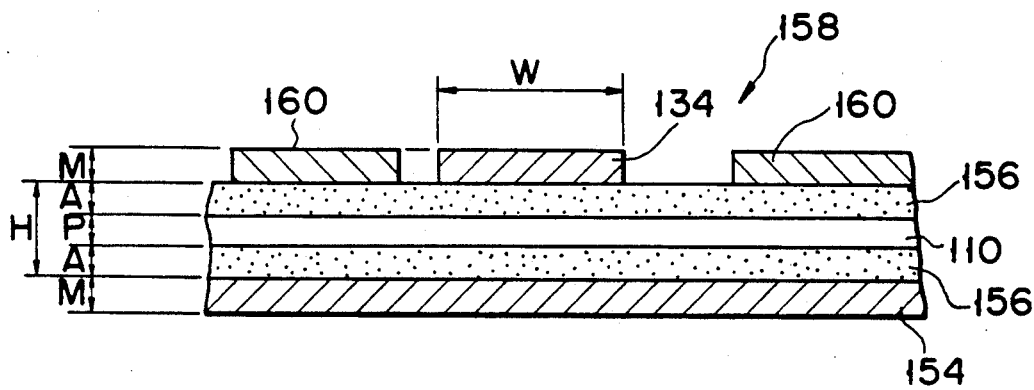
FIG. 9 is a cross-sectional view of a film carrier used in the semiconductor device according to the first embodiment.

As is shown in FIG. 9, the film carrier 158 comprises a resin film 110, adhesive sheets 156 formed on both sides of the resin film 110, a bottom ground conductor 154 formed on one of the adhesive sheets 156, a lead wire 134 formed on the other of the sheets 156, and metal films 160 distanced on both sides of the lead wire 134. The metal films 160 are formed in order to reinforce the resin film 110. In the case where the metal films 160 are not provided, even if an exposed portion 162 of the resin film 110 is curved, the film is gradually restored to its original shape by a so-called "spring-back phenomenon." However, by virtue of the reinforcement metal films 160, the film can be easily shaped, without being restored to its original shape. The metal films 160 are formed on margin areas of the film 110; thus, the presence of films 160 does not lead to an increase in size of the film carrier 158. The film carrier 158 is a microstrip type transmission line, and the characteristic impedance of the carrier 158 is 50 Ω.

The resin film 110 is provided with an opening 112 in which the semiconductor chip 114, such as a GaAs integrated circuit, is mounted.

The lead wire 134 is made of metal foil and extends to the opening 112 in which the semiconductor chip 114 is mounted. The lead wire 134 comprises inner lead 136, intermediate lead 140 and outer lead 138.

The inner lead 136 is connected to a corresponding pad provided on the chip 114 in the opening 112. The inner lead 136 and the pad on semiconductor chip 114 are connected via a bump electrode formed on the pad. The bump electrode is an Au-plated barrier metal such as Ti-Ni-Pd, Ti-W-Au, Ti-Pt-Au, or Cr-Cu-Au. The corresponding inner lead 136 is formed by plating a copper foil with Au or Sn. The bump electrode and inner lead 136 are coupled by eutectic bonding or thermocompression bonding. In this case, a tool heated to 350° to 500° C. is pressed at 30 to 80 g/lead.

The outer lead 138 is connected to a corresponding external electrode formed on the substrate 128. The intermediate lead 140 is interposed between the inner lead 136 and outer lead 138.

The resin mold 124 does not entirely cover the film carrier 158. The exposed portion 162 having transmission lines, which is situated near the outer leads 138, is not covered and is exposed. The exposed part of the film carrier 158 is bent and, as a result, the outer lead 138 and the intermediate lead 140 near the outer lead 138 are situated substantially on a level with the external electrode 130 of the substrate 128 on which the semiconductor device is mounted.

Figure 10:
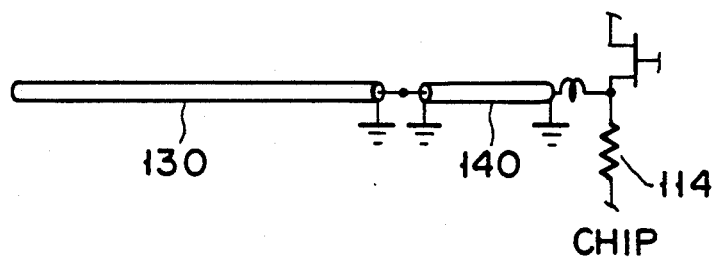
FIG. 10 shows a circuit equivalent to a transmission line of the semiconductor device according to the first embodiment.

With the above structure, as shown in FIG. 10, non-uniformity of characteristic impedances between the external electrode 130 and the lead wire 134 on resin film 110 can be decreased, when the external electrode 130 is connected to lead wire 134. Thus, advantageously, reflections of signals between the external electrode 130 and lead wire 134 can be decreased.

Referring to FIGS. 11 to 16, the positional relationship between the outer lead 138 and external electrode 130 in the exposed region 162 will be described in detail.

Figure 11:
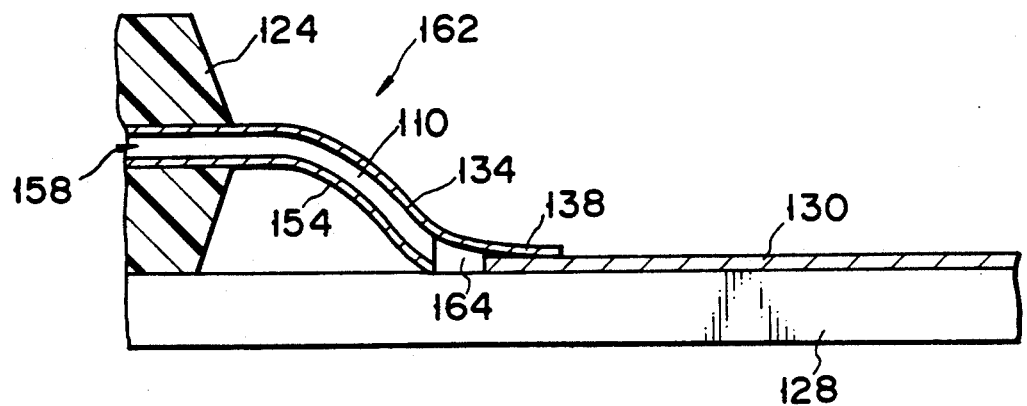
FIGS. 11 to 16 are cross-sectional views showing important structural parts of the semiconductor device according to the first embodiment of the invention.

In FIG. 11, the resin film 110 is separated from the external electrode 130 and situated over the substrate 128. The lead wire 134 is formed on the upper surface of resin film 110, and the bottom ground conductor 154 is formed on the lower surface of film 110. The outer lead 138 is electrically connected to the external electrode 130. With this construction, the outer lead 138 and that part of the intermediate lead, which is located on the resin film 110 and near the outer lead 138, can be situated substantially on a level with the external electrode 130. In this structure, since the part 164 between an end of the resin film 110 and external electrode 130 can be made very small, the characteristic impedance of the lead wire 134 and that of the external electrode can be made almost uniform. Accordingly, reflections of electric signals at the part 164 can be prevented.

Figure 1:
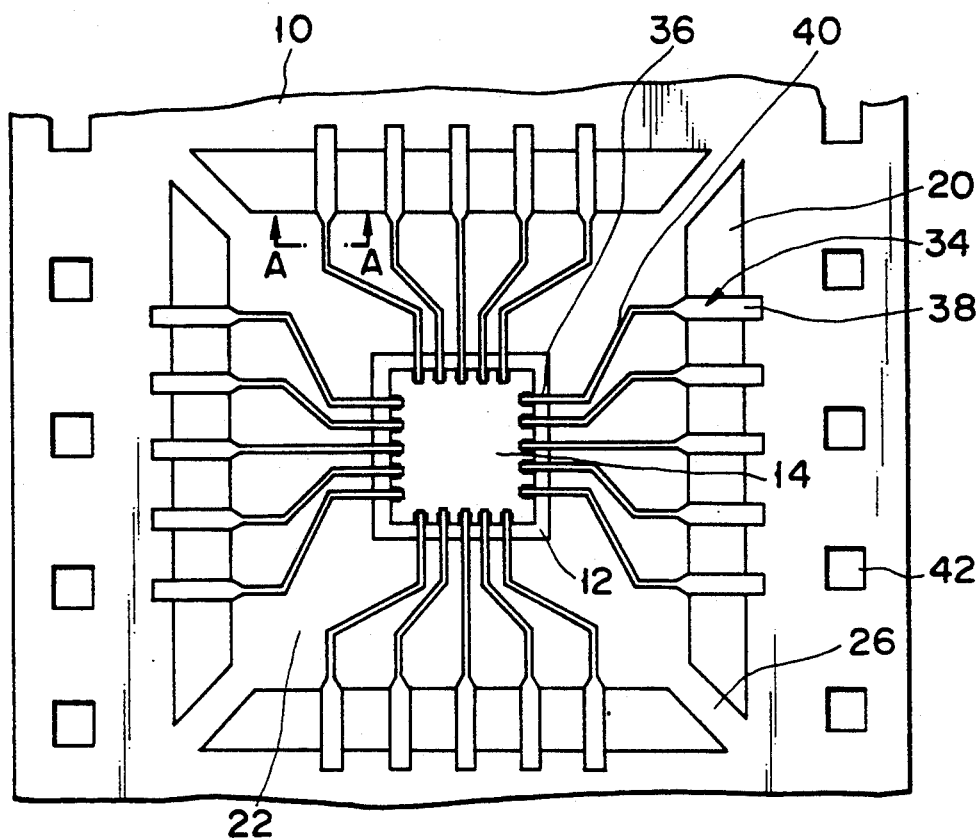
FIG. 1 is a plan view of a conventional film carrier.
Figure 2A:
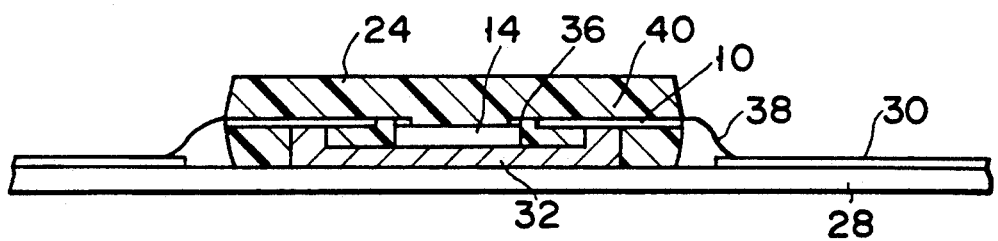
FIG. 2A is a cross-sectional view of a conventional semiconductor device.
Figure 2B:
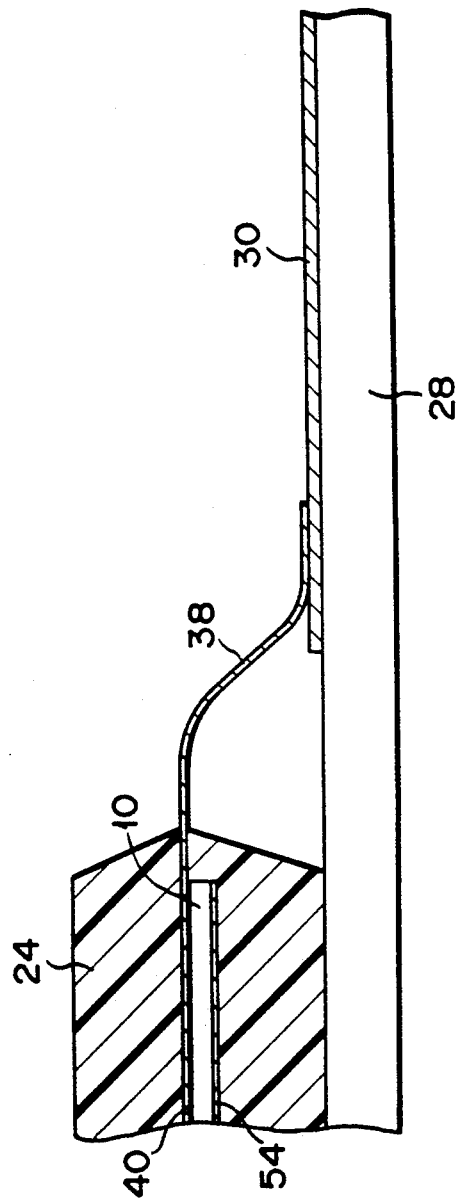
FIG. 2B is an expanded cross-sectional view of the conventional semiconductor device.
Figure 3:
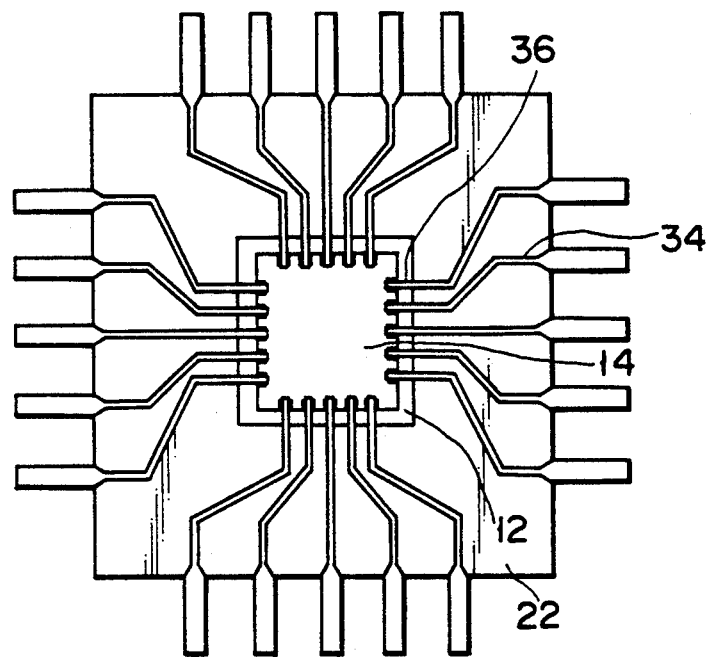
FIG. 3 is a plan view of a conventional processed film carrier.
Figure 4:
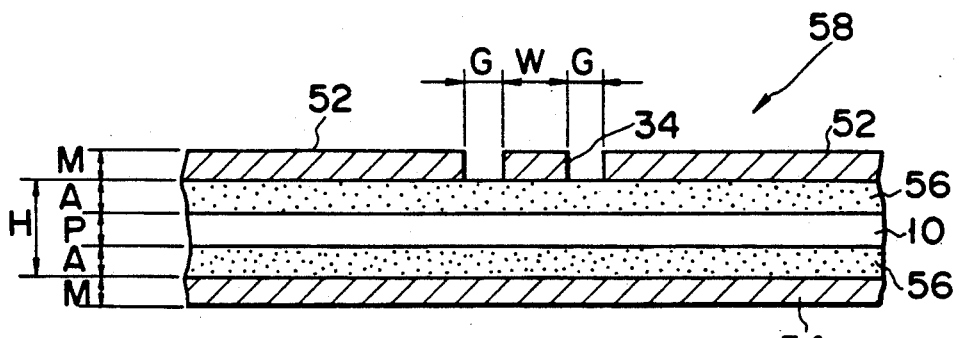
FIG. 4 is a cross-sectional view of a conventional ground suspended coplanar transmission line.
Figure 5:
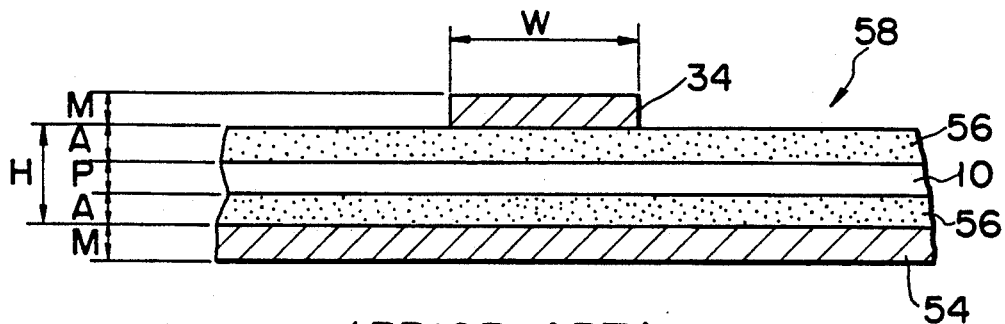
FIG. 5 is a cross-sectional view of a conventional microstrip line.
Figure 6:
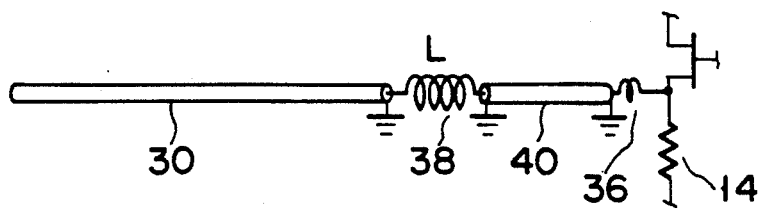
FIG. 6 shows a circuit equivalent to a transmission line of a conventional semiconductor device.
Figure 21:
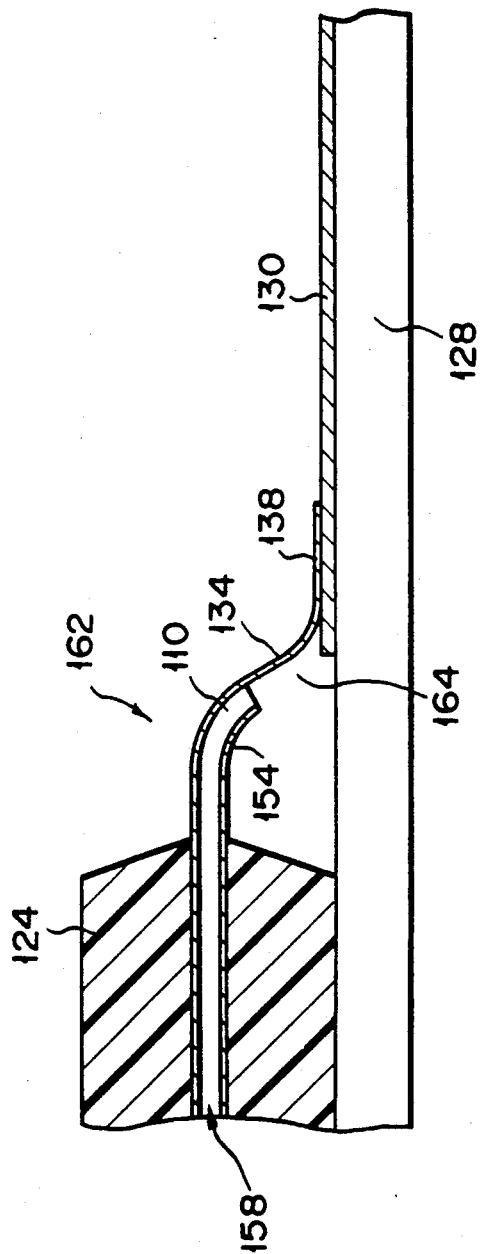
FIG. 21 is a cross-sectional view showing an important structural part of the semiconductor device according to the first embodiment of the invention.

FIG. 21 is similar to FIG. 11. In FIG. 21, the resin film 110 is separated from the external electrode 130 and is provided over the substrate 128. The lead wire 134 is formed on the upper surface of the resin film 110. The ground conductor 154 is formed on the lower surface of the film 110. The outer lead 138 and that portion of the intermediate lead 140, which is close to the outer lead and exists on the resin film 110, can be situated closer to the external electrode 130. With this construction, the separation area 164 between the end portion of the resin film 110 and the external electrode 130 is longer than in the embodiment of FIG. 11. However, compared to the prior art shown in FIG. 2B, the separation area 164 is sufficiently small. Thus, non-uniformity of the characteristic impedance of the lead wire 134 and external electrode 130 can be reduced. Therefore, the reflection of signals at the separation area 164 can be prevented.

Figure 12:
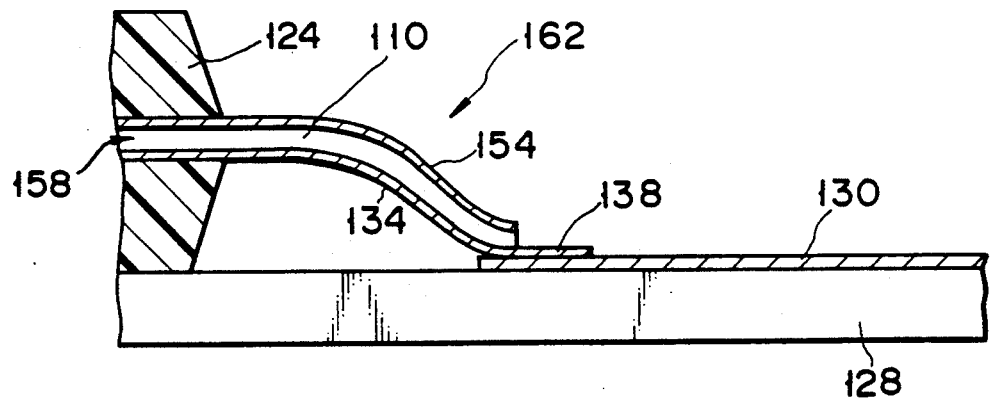

In FIG. 12, the lead wire 134 is formed on the lower surface of the resin film 110, and the ground conductor 154 is formed on the upper surface of film 110. An end portion of the resin film 110 is located over the surface of the external electrode 130. With this construction, the resin film 110 can be situated on the external electrode 130, and the characteristic impedances of the external electrode 130 and lead wire 134 can be made constant more exactly. This is because the separation area 164, as shown in FIG. 11, does not exist. Most part of the outer lead 138 is surface-contacted with the external electrode 130.

Figure 13:
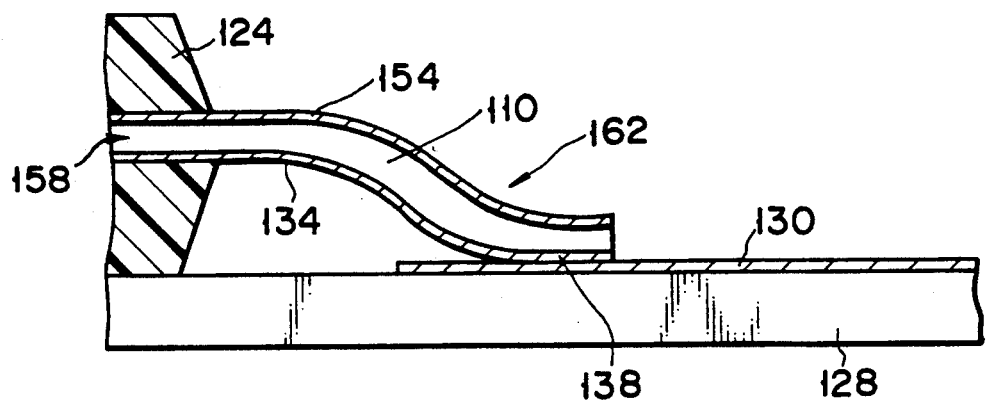

In FIG. 13, the lead wire 134 is formed on the lower surface of the resin film 110, and the entire outer lead 138 is formed on the lower surface of the resin film 110. With this construction, the resin film 110 can be situated on the external electrode 130, and the characteristic impedances of the external electrode 130 and lead wire 134 can be made constant more exactly. This is because the separation area 164, as shown in FIG. 11, does not exist. Most part of the outer lead 138 is surface-contacted with the external electrode 130.

Figure 14:
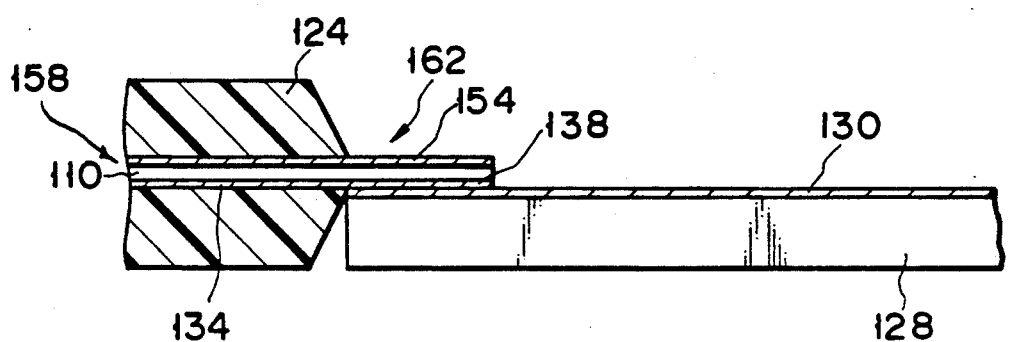

In FIG. 14, the resin mold 124 is not provided on the substrate 128. The lower surface of the film carrier 158 is situated substantially on a level with the surface of the external electrode 130. In other words, in this embodiment, the exposed portion 162 of the film carrier 158 is made flat. The lead wire 138 is provided on the lower surface of the resin film 110, and the ground conductor 154 is formed on the surface of the film 110. The entire outer lead 138 is formed on the lower surface of the resin film 110. In this embodiment, the same advantage as in the embodiment of FIG. 13 can be obtained.

Figure 15:
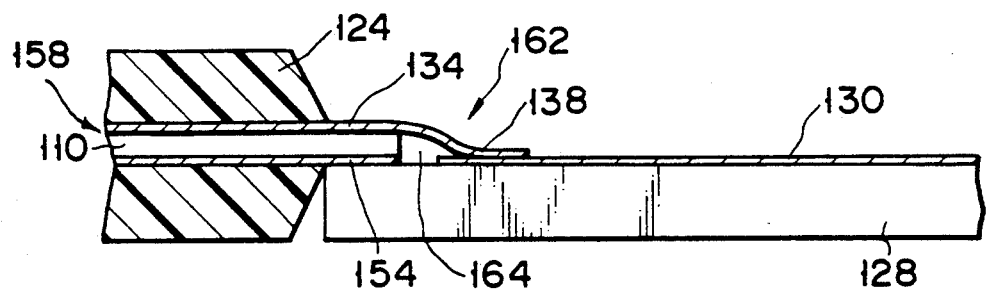

In FIG. 15, the ground conductor 154 is formed on the lower surface of the resin film 110, and the lead wire 134 is formed on the upper surface of the film 110. The resin film 110 and the external electrode 130 are separated from each other. The outer lead 138 extends from the resin film 110 and is electrically connected to the external electrode 130. Since the other structural features are identical to those of the embodiment of FIG. 14, the common structural elements are denoted by same numerals and a detailed description thereof is omitted. Since the same separation area 164 as is used in the embodiment of FIG. 11 is provided in this embodiment, the same advantage as in the embodiment of FIG. 11 can be obtained.

Figure 16:
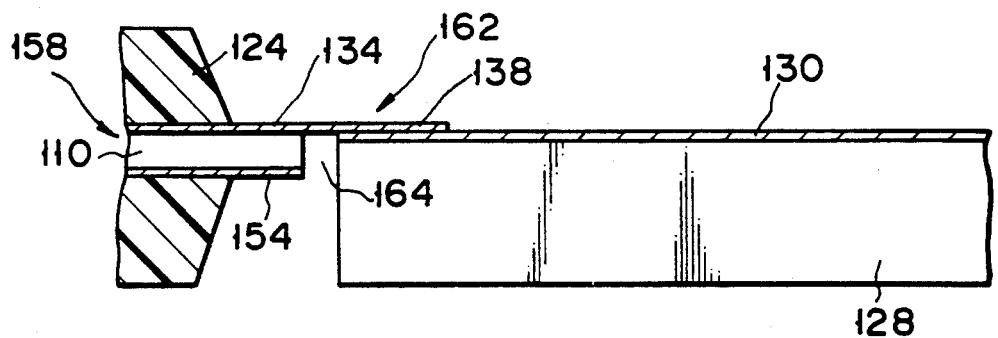

In FIG. 16, the upper surface of the end portion of the resin film 110 is formed substantially in the same plane as the surface of the external electrode 130. The lead wire 134 is formed on the upper surface of the resin film 110, and the bottom ground conductor 154 is formed on the lower surface of the film 110. The outer lead 138 extends from the resin film 110 and is electrically connected to the external electrode 130. Since the same separation area 164 a is used in the embodiment of FIG. 11 is provided in this embodiment, the same advantage as in the embodiment of FIG. 11 can be obtained.

Figure 17:
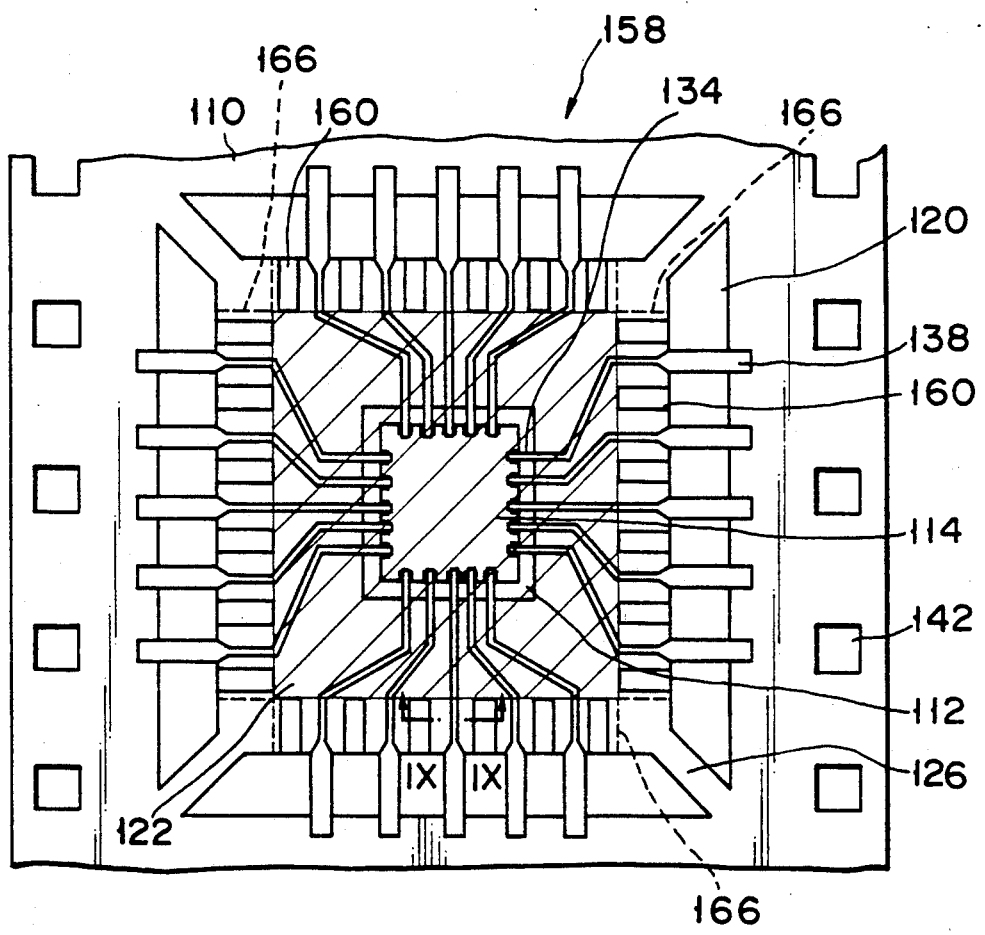
FIG. 17 is a plan view of the film carrier used in the semiconductor device according to the first embodiment.

Referring now to FIG. 9 and FIG. 17, the steps of forming the film carrier 158 will be described. FIG. 9 is a cross-sectional view taken along line IX—IX of FIG. 17.

At first, polyimide film 110 having a width of 35 mm is provided with opening 112 for mounting semiconductor chip 114 therein, openings 120 for supporting outer lead 138, and feed perforations 142. A copper foil having a thickness of 18 μm is attached to the lower surface of the resin film 110 by means of an acrylic or epoxy adhesive sheet 156. The copper foil is processed to have a predetermined pattern by means of photoetching, thereby forming bottom ground conductor 154. Thereafter, a copper foil having a thickness of 18 μm is also attached to the upper surface of the resin film 110 by mean of an acrylic or epoxy adhesive sheet 156. Then, the lower surface of the resin film 110 is coated with a photoresist, and a photoresist of a predetermined pattern is formed on the upper surface of the film 110. Photoetching is carried out to form lead wire 134 and metal film 160. The photoresists on the upper and lower surfaces of the film 110 are then removed. In this way, a plurality of lead wires 134 are formed on the resin film 110 of flexible polyimide or epoxy resin, by means of photoetching. Reference numeral 126 indicates bridge portions.

Mold resin covers mold region 122 of film carrier shown in FIG. 17. The mold region 122 is hatched in FIG. 17.

Figure 18:
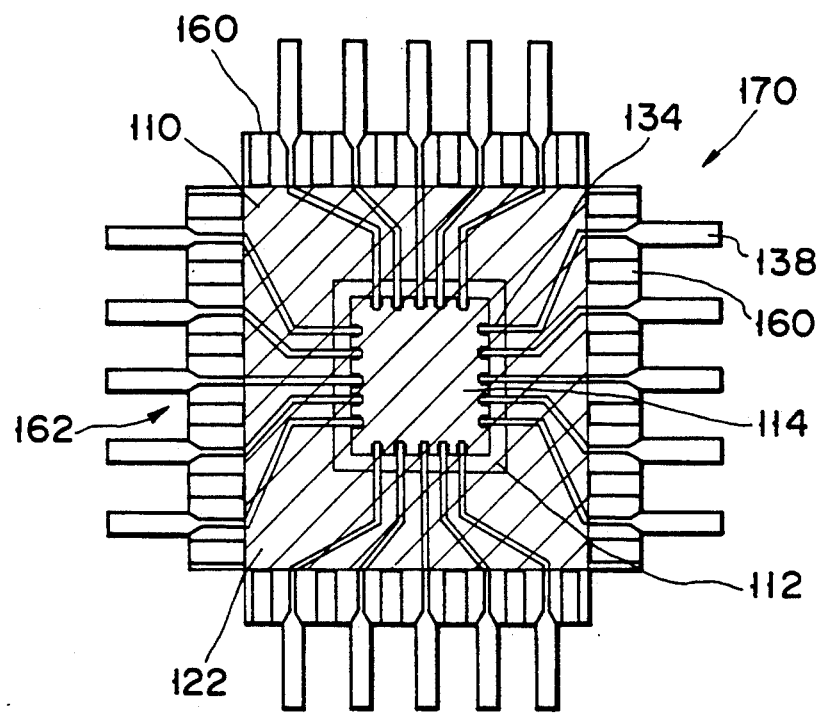
FIG. 18 is a plan view of a processed film carrier according to the present invention.

When cutting portions 166 of the elongated resin film 110 are cut off and also the outer leads 138 are cut off, the shape as shown in FIG. 18 can be obtained. Since the cutting portions 166 are located at the corners, as shown in FIG. 17, they can surely be separated and the film carrier 170 can easily be shaped. The region excluding mold region 122 becomes exposed region 162.

Figure 19:
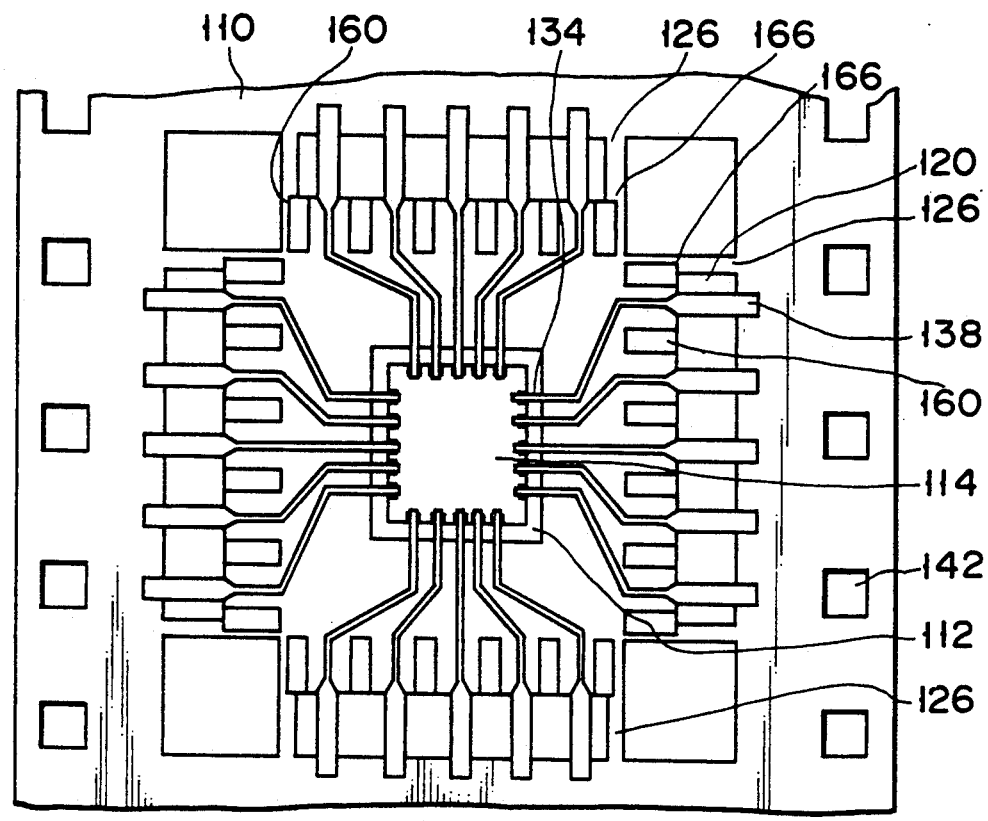
FIG. 19 is a plan view of another film carrier used in the semiconductor device according to the first embodiment.

FIG. 19 shows another film carrier 158 which differs from the film carrier 158 of FIG. 18, with respect to the positions of bridge portions 126 and cutting portions 166. The film carrier obtained after separating the cutting portions 166 has the same shape as the film carrier of FIG. 18. The film carrier 158 is characterized by the shape which allows easy cutting of the bridge portions.

Figure 20:
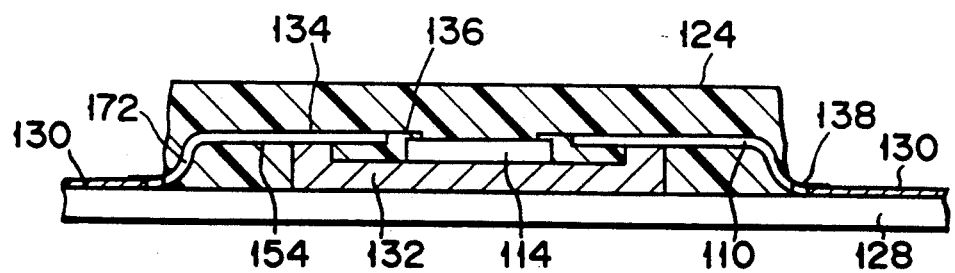
FIG. 20 is a cross-sectional view of a semiconductor device according to a second embodiment of the present invention.

Referring to FIG. 20, a semiconductor device according to a second embodiment of the present invention will now be described. In the second embodiment, the same film carrier as in the first embodiment is used, but the region of resin mold 124 differs. In the second embodiment, the entire resin film 110 is molded with resin. Like the first embodiment, the region 172 near the outer leads 138 is so bent as to be on a level with the external electrode 130 of mount substrate 128. With this construction, the outer lead can be connected to the external electrode 130 of substrate 128, with non-uniformity of characteristic impedance eliminated.

As has been described above, with use of the film carrier of this invention, the non-uniformity of characteristic impedance can be eliminated, and the external electrode and lead wire ca be advantageously connected.

In the embodiments, the length of each outer lead 138 is about 3 to 5 mm, and the length of that part of intermediate lead 140, which is substantially on a level with the outer lead 138, is about 5 mm or less. In this description, the feature that the external electrode 130 and the outer lead 138, etc. are "substantially on a level with" each other means not only the state wherein the external electrode 130 and outer lead 138, etc. are connected on the same plane, but also the state wherein the outer lead 138, etc. are contacted with and attached on the electrode 130.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor device using a film carrier, said device comprising:
   a semiconductor element with a plurality of terminals;
   a resin film with a first surface and a second surface, said film having a hole in which the semiconductor element is mounted, said film being curved so that the hole is at a different level with a periphery of said resin film;

a plurality of lead wires formed on the first surface of the resin film, each lead wire having an inner lead, an intermediate lead and an outer lead, said inner lead being situated adjacent to the hole and connected to a corresponding one of the terminals of the semiconductor element, said outer lead being situated on or adjacent to the periphery of said resin film and connected to a corresponding external electrode, said intermediate lead being situated between the inner lead and the outer lead, at least said intermediate lead being formed on the first surface of the film; and means for impedance-controlling each outer lead and that portion of the intermediate lead close to the outer lead with such a structure that an end portion of the periphery of said resin film is substantially on a level with the external electrode.

2. The semiconductor device according to claim 1, wherein the end portion of the resin film is separated from the external electrode, and the outer lead extending from the intermediate lead is connected to the corresponding external electrode.

3. The semiconductor device according to claim 2, wherein the outer lead extending from the intermediate lead is situated substantially on a level with the corresponding external electrode.

4. The semiconductor device according to claim 1, wherein the end portion of the one of the first and second surfaces is situated over the surface of the external electrode, and the outer lead extending from the intermediate lead is connected to the corresponding external electrode.

5. The semiconductor device according to claim 4, wherein the outer lead is formed on the one of the first and second surfaces and is surface-contacted with the corresponding external electrode.

6. The semiconductor device according to claim 1, further comprising:
a metal film, formed on the first or second surface of the resin film, for reinforcing the resin film and preventing the resin film from deforming.

7. The semiconductor device according to claim 1, further comprising:
an insulator covering at least that part of the resin film, on which the inner lead and the intermediate lead are formed.

8. The semiconductor device according to claim 7, wherein most part of the resin film is covered with said insulator.

9. A semiconductor device using a film carrier, said device comprising:
a first substrate;
a semiconductor element mounted on the first substrate and having a plurality of terminals;
a resin film having a first surface and a second surface, said film having a hole in which the semiconductor element is mounted, said film being curved so that the hole is at a different level with a periphery of said resin film;
a plurality of lead wires formed on the first surface of the resin film, each lead wire having an inner lead, an intermediate lead and an outer lead, said inner lead being situated adjacent to the hole and connected to a corresponding one of the terminals of the semiconductor element, said intermediate lead being situated between the inner lead and the outer lead, and at least said intermediate lead being formed on the first surface of the film;
a plurality of external electrodes connected to the corresponding outer leads
means for impedance-controlling the outer lead and that portion of the intermediate lead close to the outer lead with such a structure that an end portion of the periphery of said resin film is substantially on a level with the external electrode; and
a second substrate on which said external electrodes are provided.

10. The semiconductor device according to claim 9, wherein the end portion of the resin film is separated from the external electrode, and the outer lead extending from the intermediate lead is connected to the corresponding external electrode.

11. The semiconductor device according to claim 10, wherein the outer lead extending from the intermediate lead is situated substantially on a level with the corresponding external electrode.

12. The semiconductor device according to claim 10, wherein the end portion of the one of the first and second surfaces of the resin film is substantially on a level with the surface of the second substrate, and the outer lead extending form the intermediate lead is on a level with the corresponding external electrode.

13. The semiconductor device according to claim 10, wherein an end portion of the other one of the first and second surfaces of the resin film is situated on the surface of the second substrate, and the outer lead extending from the intermediate lead is on a level with the corresponding external electrode.

14. The semiconductor device according to claim 9, wherein the end portion of the one of the first and second surfaces is situated over the surface of the external electrode, and the outer lead extending from the intermediate lead is connected to the corresponding external electrode.

15. The semiconductor device according to claim 14, wherein the outer lead is formed on the one of the first and second surfaces and is surface-contacted with the corresponding external electrode.

16. The semiconductor device according to claim 9, further comprising:
a metal film, formed on the first or second surface of the resin film, for reinforcing the resin film and preventing the resin film from deforming.

17. The semiconductor device according to claim 9, further comprising:
an insulator covering at least that part of the resin film, on which the inner lead and the intermediate lead are formed.

18. The semiconductor device according to claim 17, wherein most part of the resin film is covered with said insulator.

19. A film carrier comprising:
a resin film with a first plane and a second plane, said film having a first hole in which a semiconductor element is mounted;
a plurality of lead wires formed on the first plane of the resin film, each lead wire having an inner lead, an intermediate lead and an outer lead, said inner lead being provided for connection with a corresponding one of the terminals of the semiconductor element, said intermediate lead being situated between the inner lead and the outer lead, at least said intermediate lead being formed on the first and plane of the film, and said outer lead being provided for connection with the corresponding external electrode;

wherein said resin film has a second hole below the outer lead, said second hole forms an aperture completely through said resin film to separate a main part of the outer lead from said resin film, and said second hole is situated so as to surround the first hole; and wherein a region of the resin film, which is surrounded by the second hole, is greater than a region of the resin film to be molded with an insulator.

20. The film carrier according to claim 19, wherein the region of the resin film, which is surrounded by the second hole, has a substantially rectangular shape, and the four corners of the region is provided with cutting portions for enabling end portions of the region to be bent.

21. A semiconductor device using a film carrier, said device comprising:
- a semiconductor element with a plurality of terminals;
- a resin film with a first plane and a second plane, said film having a hole in which the semiconductor element is mounted;
- a plurality of lead wires formed on the first plane of the resin film, each lead wire having an inner lead, an intermediate lead and an outer lead, said inner lead being situated adjacent to the hole and connected to a corresponding one of the terminals of the semiconductor element, said outer lead being situated on or adjacent to the periphery of said resin film and connected to a corresponding external electrode, said intermediate lead being situated between the inner lead and the outer lead, at least said intermediate lead being formed on the first plane of the film;
- an insulator covering at least that part of the resin film on which the inner lead and the intermediate lead are formed; and
- means for impedance-controlling each outer lead and that portion of the intermediate lead close to the outer lead, which are exposed from said insulator, with such a structure that an end portion of the periphery of said resin film is substantially on a level with the external electrode and extends from said insulator toward a contact portion between the outer lead and the external electrode.

22. The semiconductor device according to claim 1, wherein said impedance-control means includes a coplanar structure.

23. The semiconductor device according to claim 9, wherein said impedance-control means includes a coplanar structure.

24. The semiconductor device according to claim 21, wherein said impedance-control means includes a coplanar structure.

25. The semiconductor device according to claim 1, wherein said impedance-control means includes a microstrip structure.

26. The semiconductor device according to claim 9, wherein said impedance-control means includes a microstrip structure.

27. The semiconductor device according to claim 21, wherein said impedance-control means includes a microstrip structure.

* * * * *